(12) United States Patent
Husted

(10) Patent No.: US 8,379,548 B1
(45) Date of Patent: Feb. 19, 2013

(54) ARCHITECTURE FOR SIMULTANEOUS TRANSMISSION OF MULTIPLE PROTOCOLS IN A WIRELESS DEVICE

(75) Inventor: Paul J. Husted, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 242 days.

(21) Appl. No.: 12/399,350

(22) Filed: Mar. 6, 2009

(51) Int. Cl.
*H04L 5/00* (2006.01)

(52) U.S. Cl. ...................... 370/297; 370/310; 455/232.1

(58) Field of Classification Search .................. None
See application file for complete search history.

(56) References Cited

U.S. PATENT DOCUMENTS

| | | | |
|---|---|---|---|
| 6,882,226 B2 * | 4/2005 | Cho et al. ....................... | 330/282 |
| 7,161,936 B1 * | 1/2007 | Barrass et al. ................ | 370/387 |
| 7,184,500 B2 | 2/2007 | Li et al. | |
| 7,519,390 B2 | 4/2009 | Malone et al. | |
| 7,818,029 B2 * | 10/2010 | Sanguinetti ................ | 455/552.1 |
| 2001/0011926 A1 * | 8/2001 | Adar .............................. | 330/126 |
| 2004/0120421 A1 | 6/2004 | Filipovic | |
| 2004/0152429 A1 | 8/2004 | Haub et al. | |
| 2004/0203367 A1 | 10/2004 | Nowlin | |
| 2005/0133467 A1 * | 6/2005 | Trachewsky et al. ......... | 210/803 |
| 2007/0109973 A1 | 5/2007 | Trachewsky | |
| 2008/0084922 A1 | 4/2008 | Kleveland et al. | |
| 2008/0137566 A1 * | 6/2008 | Marholev et al. ............. | 370/310 |
| 2010/0216524 A1 * | 8/2010 | Thomas et al. ............... | 455/574 |

* cited by examiner

*Primary Examiner* — Kevin C Harper
*Assistant Examiner* — Samina Choudhry
(74) *Attorney, Agent, or Firm* — Bay Area Technology Law Group PC

(57) ABSTRACT

A wireless device that simultaneously transmits first wireless signals according to a first protocol and second wireless signals according to a second protocol. The wireless device may comprise an antenna, first wireless protocol circuitry, second wireless protocol circuitry, a switch, and at least one gain element. The first wireless protocol circuitry sends first signals according to the first wireless protocol. The second wireless protocol circuitry sends second signals according to the second wireless protocol. The switch comprises a combiner. The switch receives the first signals and the second signals, combines the first signals and the second signals to produce third signals having aspects of the first signals and the second signals, and sends the third signals to a gain element. The gain element amplifies the third signals and sends the amplified third signals to the antenna. The antenna wirelessly transmits the amplified third signals.

19 Claims, 4 Drawing Sheets

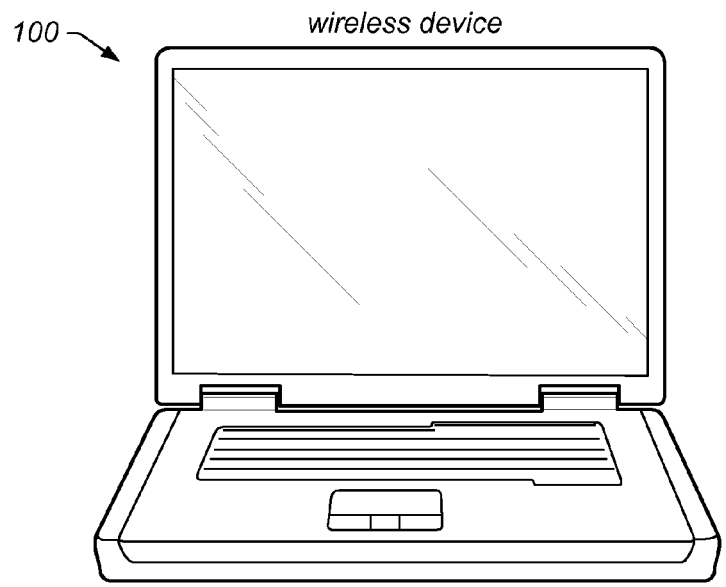
*FIG. 1A*
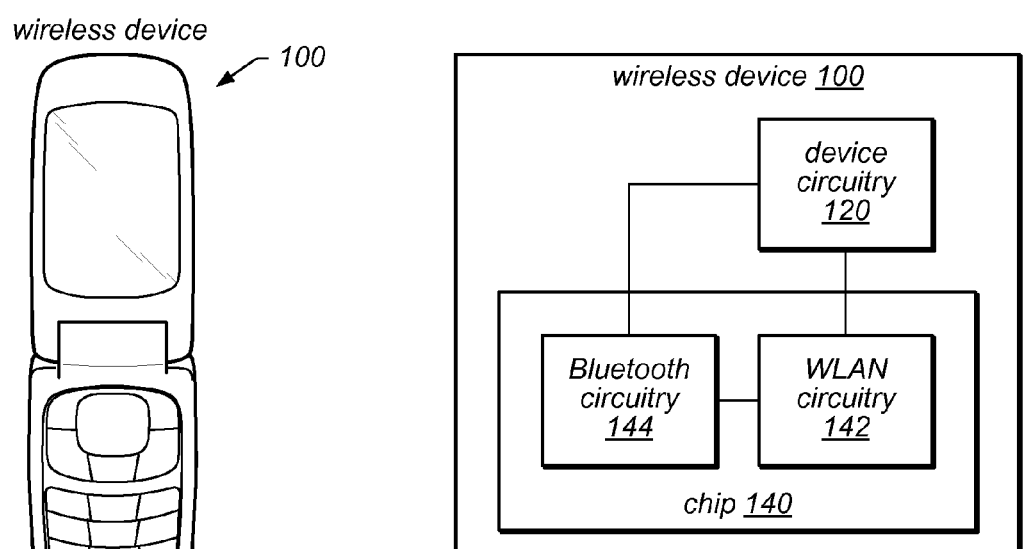
*FIG. 1B*
*FIG. 2*

ARCHITECTURE FOR SIMULTANEOUS TRANSMISSION OF MULTIPLE PROTOCOLS IN A WIRELESS DEVICE

FIELD OF THE DISCLOSURE

The present invention relates generally to wireless communication, and more particularly to simultaneous transmission of wireless signals of different wireless protocols.

DESCRIPTION OF THE RELATED ART

Wireless communication is being used for a plethora of applications, such as in laptops, cell phones, and other wireless communication devices ("wireless devices"). In fact, wireless communication is becoming so widely used, it is common for wireless devices to be able to communicate using a plurality of different wireless communication protocols. Accordingly, it is common for a wireless device to have different circuit portions that implement different wireless protocols.

A wireless device that implements multiple wireless protocols requires a way to transmit each wireless protocol. In some wireless devices, a separate antenna is used to transmit each wireless protocol. However, this costs more and requires more space than using a single antenna. This can present a problem, especially on smaller platforms.

A prior art single antenna solution uses a switched architecture, in which only one protocol operates, either transmitting or receiving, at a time. However, as this only allows one function at a time, co-existence performance is poor.

Accordingly, improvements in wireless devices are desired.

SUMMARY OF THE INVENTION

Embodiments of the invention relate to a wireless device that can simultaneously transmit signals according to multiple wireless protocols. The device may include an antenna for transmitting wireless signals. The device may further include first wireless protocol circuitry configured to send first signals according to a first wireless protocol and second wireless protocol circuitry configured to send second signals according to a second wireless protocol. The first wireless protocol circuitry and the second wireless protocol circuitry may be comprised on a chip in the device. The device may include a switch coupled to the first wireless protocol circuitry and to the second wireless protocol circuitry. The device may also include one or more gain elements, each of which may be coupled to the switch. Each of the one or more gain elements may also be coupled to the antenna.

The switch may be a crossbar switch (or may include the capabilities of a crossbar switch). The switch may include a combiner, and may be configured to combine the first signals and the second signals into third signals. The third signals may thus include at least a portion of the first signals and at least a portion of the second signals. The switch may be configured to send the third signals to a gain element. The gain element may amplify the third signals to produce amplified third signals.

The gain element may be one of a plurality of gain elements in the device. One or more of the plurality of gain elements may be coupled to the switch, and the switch may be operable to send the third signals to any of the gain elements coupled to the switch. Each of the gain elements coupled to the switch may be configured to amplify signals by a different amount. Thus, the third signals may be amplified by a different amount depending on which gain element receives the third signals from the switch.

The gain element having amplified the third signals may optionally send the amplified third signals to one or more additional gain elements, which may further amplify the third signals. The additional gain element(s) may then send the further amplified signals to the antenna for transmitting. Alternatively, the gain element may simply send the amplified third signals to the antenna for transmitting with no intervening additional gain element. The antenna may then transmit wirelessly the amplified third signals.

As the third signals may include aspects of the first signals and the second signals, the antenna wirelessly transmitting the amplified third signals may effectively comprise simultaneously transmitting the first signals according to the first wireless protocol and the second wireless signals according to the second wireless protocol.

The antenna may also be configured to wirelessly receive signals. Alternatively, there may be an additional antenna for wirelessly receiving signals.

The first wireless protocol may be Wireless LAN (WLAN). The second wireless protocol may be Bluetooth.

Other embodiments relate to a method for use in a wireless device. The method may provide a way to simultaneously transmit first wireless signals according to a first wireless protocol and second wireless signals according to a second wireless protocol. Elements of the method according to one embodiment are provided as follows. A first wireless protocol circuitry may send first signals according to the first wireless protocol to a switch. A second wireless protocol circuitry may send second signals according to the second wireless protocol to the switch. The switch may receive the first signals and the second signals, combine the first signals and the second signals into third signals which comprise at least a portion of the first signals and at least a portion of the second signals, and send the third signals to a gain element. The gain element may receive the third signals, amplify the third signals to produce amplified third signals, and send the amplified third signals to an antenna for transmitting.

Another set of embodiments relates to a chip for use in a wireless device. The chip may include first wireless protocol circuitry configured to send first signals according to a first wireless protocol. The chip may also include second wireless protocol circuitry configured to send second signals according to a second wireless protocol. The chip may include a switch coupled to the first wireless protocol circuitry and to the second wireless protocol circuitry. In addition, the chip may include one or more gain elements coupled to the switch. The switch may include a combiner.

The switch may be configured to combine the first signals and the second signals into third signals. The third signals may include at least a portion of the first signals and at least a portion of the second signals. The switch may be configured to send the third signals to at least one gain element of the one or more gain elements. The at least one gain element may be configured to amplify the third signals to produce amplified third signals. The at least one gain element may be further configured to send the amplified third signals to an antenna for transmitting.

BRIEF DESCRIPTION OF THE DRAWINGS

A better understanding of the present invention can be obtained when the following Detailed Description of the Embodiments is read in conjunction with the following drawings, in which:

FIGS. 1A and 1B illustrate exemplary wireless devices, according to one embodiment;

FIG. 2 is an exemplary block diagram of the wireless devices of FIGS. 1A and 1B, according to one embodiment;

Figure 3:
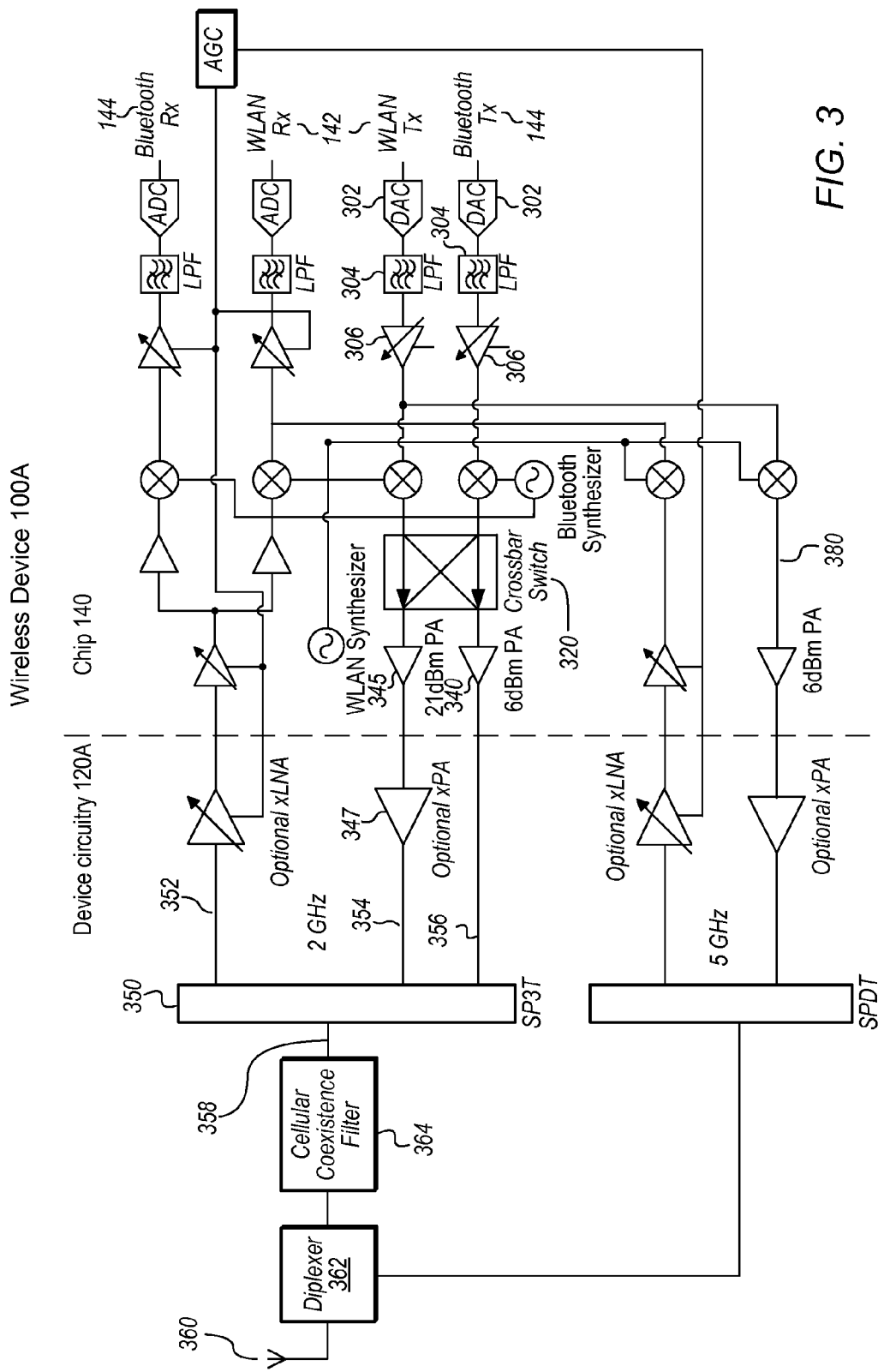
FIG. 3 is a more detailed exemplary block diagram of the wireless devices of FIGS. 1A and 1B, illustrating circuitry of the exemplary wireless devices, according to one embodiment

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

FIGS. 1A and 1B—Exemplary Wireless Devices

FIGS. 1A and 1B illustrate an exemplary wireless device 100, according to one embodiment. As shown in FIG. 1A, the wireless device 100 may be a portable computer or other mobile computing device. Alternatively, as shown in FIG. 1B, the wireless device 100 may be a cell phone or smart phone or other similar mobile device (which may also be classified as a mobile computing device). However, it should be noted that other wireless devices are envisioned, such as personal digital assistants, multimedia players (portable or stationary), routers, and/or other mobile devices/computing systems which are operable to use wireless communication.

The wireless device 100 may be configured to perform wireless communication using a first wireless protocol and/or a second wireless protocol. For example, the wireless device 100 may be configured to perform wireless communication using only the first wireless protocol, using only the second wireless protocol, or simultaneously using both the first and second wireless protocol. The first and second wireless protocols may be any of various types of protocols. In some embodiments, the first wireless protocol may be a WLAN protocol. Additionally, the second wireless protocol may be a short range wireless communication protocol, such as Bluetooth. As used herein, a short range wireless protocol may refer to wireless protocols which support distances of up to 1 meter to 10 meters, or in higher powered devices, 100 meters.

FIG. 2—Exemplary Block Diagram of the Wireless Device

As shown in FIG. 2, the wireless device 100 may include device circuitry 120 (for performing various functions of the wireless device), and chip circuitry 140. The chip circuitry may contain the first wireless protocol circuitry 142, and second wireless protocol circuitry 144. Each of the first wireless protocol circuitry 142 and the second wireless protocol circuitry 144 may be implemented in any of various ways, such as analog logic, digital logic, a processor and memory (such as a CPU, DSP, microcontroller, etc.), an ASIC (application specific integrated circuit), an FPGA (field programmable gate array), or any combination of the above.

In one embodiment, the first wireless protocol circuitry 142 and the second wireless protocol circuitry 144 may both be comprised on a chip 140. Alternatively, the first wireless protocol circuitry 142 may be comprised on a first chip, and the second wireless protocol circuitry 144 may be comprised on a second chip. As used herein, the term "chip" has the full extent of its ordinary meaning, and includes an electronic device, e.g., a semiconductor device, that may be implemented in any of the ways described above for the first wireless protocol circuitry 142 and the second wireless protocol circuitry 144. According to another embodiment, the first wireless protocol circuitry and the second wireless protocol circuitry may simply be incorporated into the device circuitry. Any of the various ways of implementing the circuitry listed above may also be used in this case.

In one exemplary embodiment, the first wireless protocol circuitry 142 may be WLAN circuitry 142 and the second wireless protocol circuitry 144 may be Bluetooth circuitry 144. The WLAN circuitry 142 and the Bluetooth 144 circuitry may be co-located, e.g., may be located in the same wireless device 100. The device 100 may include logic for providing a received signal to each of the first wireless protocol circuitry 142 and the second wireless protocol circuitry 144 without any loss in sensitivity.

In various embodiments, the wireless device 100 may utilize a single antenna, e.g. for both reception and transmission (referred to herein as 100A, with corresponding device circuitry referred to as 120A), or dual antennas, e.g. one antenna for transmission and one antenna for reception (referred to herein as 100B, with corresponding device circuitry referred to as 120B).

Additionally, the wireless device 100 may include one or more wireless or wired ports for communicating over a network. The wireless device 100 (e.g., the device circuitry 120) may further include one or more memory mediums and processors for implementing various functionality. The wireless device 100 may operate as described herein.

FIG. 3—Exemplary System Diagram of the Wireless Device

FIG. 3 is an exemplary system diagram of a wireless device 100A utilizing a single antenna for both transmission and reception. As shown, the wireless device 100A may comprise first wireless protocol circuitry 142 (e.g., WLAN) and second wireless protocol circuitry 144 (e.g., Bluetooth). The wireless device 100 may comprise a switch, which may be a crossbar switch 320, and may further include a combiner as part of the crossbar switch 320. The wireless device 100A may additionally include one or more gain elements 340, 345. The wireless device may also include an antenna 360.

The WLAN circuitry 142 may have logic both for receiving and processing signals as well as sending signals. The Bluetooth circuitry 144 may similarly have logic both for receiving and processing signals as well as sending signals. As shown in FIG. 3, the WLAN circuitry 142 and Bluetooth circuitry 144 may both be comprised on a single chip 140. There may also be additional device circuitry 120A in the wireless device 100, which may for example be comprised on a printed circuit board. In addition to the circuitry dedicated to signal transmission, described in detail below, the chip and/or the device circuitry may also have circuit portions dedicated to pre-processing received signals according to various embodiments. Exemplary circuit portions according to one such embodiment are shown in FIG. 3 for completeness, although not described in detail herein.

The WLAN 142 and Bluetooth 144 circuitries may be configured to send signals according to their respective protocols to the crossbar switch 320. As shown in the exemplary embodiment, the signals may each be modified or "processed" between the WLAN circuitry 142 or the Bluetooth circuitry 144 and the crossbar switch 320, e.g. Digital-to-Analog conversion by a Digital to Analog converter (DAC)

302, filtering by a Low Pass Filter (LPF) 304, and/or amplification by a Low Noise Filter (LNA) 306. Other processes may also be included. It should also be noted that although the WLAN and Bluetooth signals go through the same processing elements (e.g. DAC, LPF, and LNA) in the embodiment shown, in other embodiments the respective signals may be processed in different ways from each other, or may be sent directly to the switch. In some embodiments, these processes may be considered part of the respective WLAN circuitry 142 or Bluetooth circuitry 144.

The signals may be received from both the WLAN transmit path and the Bluetooth transmit path at the crossbar switch 320. As noted above, the crossbar switch may include a combiner and thus may be configured to combine the signals. Combining the WLAN and Bluetooth signals produces third signals which may have aspects of both the WLAN signals and the Bluetooth signals. The crossbar switch 320 may be operable to send the third signals to a gain element coupled to the switch.

As in the embodiment shown, there may be a plurality of gain elements (e.g. 340 and 345), and the switch may be operable to send the third signals to any of the plurality of coupled gain elements. In the exemplary embodiment there is a 6 dBm Power Amplifier (PA) 340 and a 21 dBm PA 345. The crossbar switch 320 may for example be configured to send the third signals to the 6 dBm PA 340 if both WLAN and Bluetooth want to transmit at a lower power, and may be configured to send the third signals to the higher power 21 dBm PA if either WLAN or Bluetooth wants to transmit at a higher power. Both of these cases can happen often; for example, Bluetooth may start below 4 dBm, but is often expected to go to 10 or 12 dBm or higher in some conditions. WLAN may likewise be expected to transmit at lower power for some conditions, e.g. BT 3.0 AMP, which may require a low transmit power when at close range.

In the embodiment shown, there are two gain elements 340, 345 coupled to the crossbar switch 320, however, it should be noted that other embodiments with different numbers of gain elements coupled to the switch, e.g. to provide intermediate (or higher or lower) amplification options are also envisioned. Alternatively, there may be one or more additional gain elements for each of one or more of the gain elements coupled to the switch. For example, as shown in FIG. 3, there is an optional External Power Amplifier (xPA) 347 coupled to the 21 dBm PA 345, which may provide additional amplification if desired.

Each of the PAs 340 and 345 may be configured to send the amplified third signals to the antenna 360 for transmitting. The configuration may be as shown in FIG. 3, although the exact configuration may differ according to various embodiments. There may be a switch 350 to connect the path 354, 356 of each gain element (PA 340 and PA 345) with the path 358 to the antenna 360. In the exemplary embodiment the switch 350 also connects the antenna 360 to a shared receive path 352. Thus, as shown, the switch 350 may be a single-pole-triple-throw switch 350 connecting the antenna 360 (by way of a diplexer 362 and a cellular coexistence filter 364 along path 358) to a transmit path 354 corresponding to the 21 dBm PA 345 and the xPA 347, a transmit path 356 corresponding to the 6 dBm PA 340, or the shared receive path 352. Other configurations, such as one discussed below with regard to FIG. 4, may also be possible.

As in the embodiment shown, Bluetooth may operate in the 2 GHz range. The WLAN may also operate in the 2 GHz range. The WLAN may also be able to operate in the 5 GHz range, as described by IEEE 802.11a, in some embodiments. In the implementation shown (though not necessarily in all possible implementations), the WLAN may operate at either 2 or 5 GHz, but not in both frequencies at the same time. As the diplexer 362 can efficiently combine the low and high frequencies, the 5 GHz signals can use a separate transmit path 380. In other words, when the WLAN transmits at 5 GHz, the WLAN signals may not use the transmit path through the crossbar switch 320 and the associated gain elements 340, 345 and may instead use the transmit path 380. The WLAN and Bluetooth signals may combine using the crossbar switch 320 and a gain element 340 or 345 only when they are in the same frequency range, e.g. 2 GHz as in the exemplary embodiment. The 5 GHz path is thus shown only for completeness with regard to this particular embodiment.

As noted above (and shown in FIG. 3), both Bluetooth and WLAN may operate in the 2 GHz frequency range; in some embodiments both Bluetooth and WLAN may both exist specifically in the 2.4 GHz ISM band. It is worth noting that although both may exist in the same frequency band, in some embodiments they may not both be transmitting at the same frequency, nor receiving at the same frequency. For example, Bluetooth may use adaptive frequency hopping (AFH) to avoid overlap. In some embodiments, this may result in a difference in frequency of between 10 and 60 MHz. In other embodiments, the separation in frequency may be within a smaller or larger range.

Figure 4:
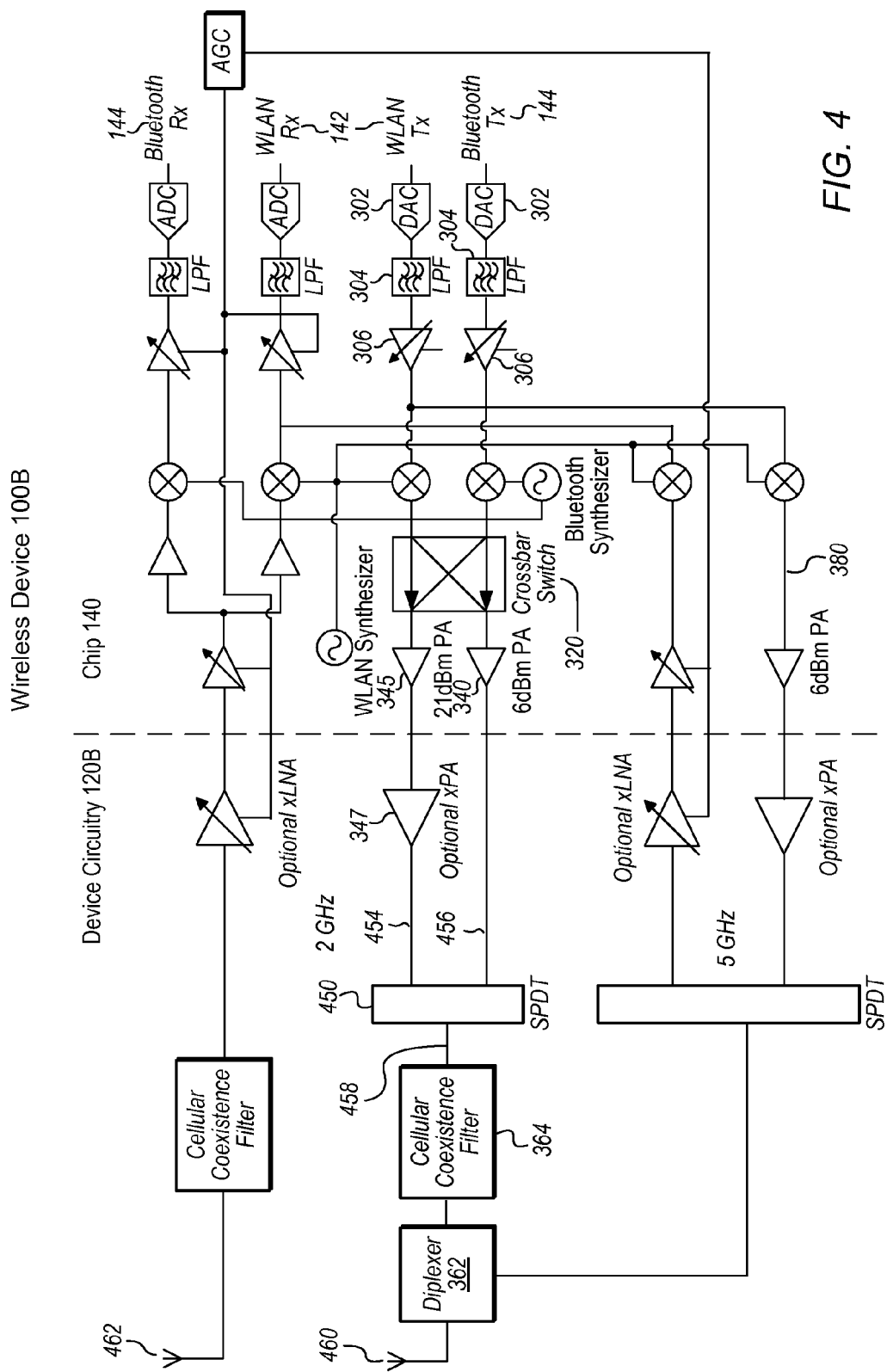
FIG. 4 is a block diagram of an alternate embodiment of the wireless devices of FIGS. 1A and 1B.

FIG. 4—Alternate Embodiment with Two Antennas

FIG. 4 illustrates an embodiment of a wireless device 100B using separate antennas for transmission and reception of 2 GHz wireless signals. Such an embodiment may take up more space on the wireless device 100 than a single antenna solution 100A, but may also provide improved sensitivity. Additionally, with sufficient isolation of the antennas, this may also allow reception of signals according to one protocol simultaneously with transmission of signals according to the other protocol. Thus for example, Bluetooth signals might be received on one antenna while WLAN signals might be transmitted on the other antenna, or vice versa. This functionality may be possible in addition to allowing simultaneous transmission of both Bluetooth and WLAN, or simultaneous reception of both Bluetooth and WLAN. In some cases this may be preferred, as opposed to the single antenna solution of FIG. 3, which may in some embodiments only allow for simultaneous transmission of both Bluetooth and WLAN or simultaneous reception of both Bluetooth and WLAN. In some embodiments, an antenna isolation of 30 dB or more, in combination with frequency separation (e.g., due to Bluetooth's AFH), may result in very good performance with respect to simultaneous transmission of Bluetooth and reception of WLAN or vice versa. In some embodiments, e.g., with antenna isolation of 40 dB or more in combination with frequency separation, near perfect operation may be possible.

The wireless device 100B shown in FIG. 4 may implement some similar circuit portions as the single antenna wireless device 100A. The embodiment shown may be described as follows. There may be a chip 140 implementing a first wireless protocol circuitry 142 (e.g. WLAN) and a second wireless protocol circuitry 144 (e.g. Bluetooth). There may also be device circuitry 120B, which may differ slightly (or significantly) from the device circuitry 120A of the single antenna wireless device 100A.

There may be a WLAN circuit portion 142 and a Bluetooth circuit portion 144, which may send WLAN signals and Bluetooth signals respectively to a crossbar switch 320. Processing steps using e.g. a DAC 302, LPF 304, and Amplifier 306 may operate on the signals from WLAN and Bluetooth circuit portions 142 and 144 respectively to the crossbar switch 320. The WLAN and Bluetooth signals may be combined at the crossbar switch 320 into third signals having aspects of both the WLAN and the Bluetooth signals. The third signals may be sent to either a 6 dBm PA 340 or a 21 dBm PA 345, where the third signals may be amplified to produce amplified third signals. There may be an optional xPA 347 after the 21 dBm PA 345, which may provide further amplification. However, instead of the single-pole-triple-throw switch 350 of FIG. 3, there may be a single-pole-double-throw switch 450 connecting each of the PAs 340 and 345 to the transmission antenna 460. In this embodiment the single-pole-double-throw switch 450 may be sufficient as there may be a separate antenna 462 for receiving signals.

Thus, in general a dual antenna wireless device 100B may operate similarly to the single antenna wireless device 100A shown in FIG. 3. The primary difference may be that in the dual antenna device 100B, the amplified third signals may be sent directly to the antenna 460 and do not have to share the switch 450 with the shared wirelessly received signals. Thus, simultaneous transmission of Bluetooth signals and reception of WLAN signals, or simultaneous transmission of WLAN signals and reception of Bluetooth signals, may be possible.

Although the above description primarily describes the details of the particular embodiment shown in FIG. 4, it is not intended to limit the scope of the set of embodiments utilizing multiple antennas. Rather, a broad scope for variation and modifications, in general at least equal to the scope described with relation to the single antenna embodiment of FIG. 3, is intended and envisioned with regard to multiple antenna embodiments.

Figure 5:
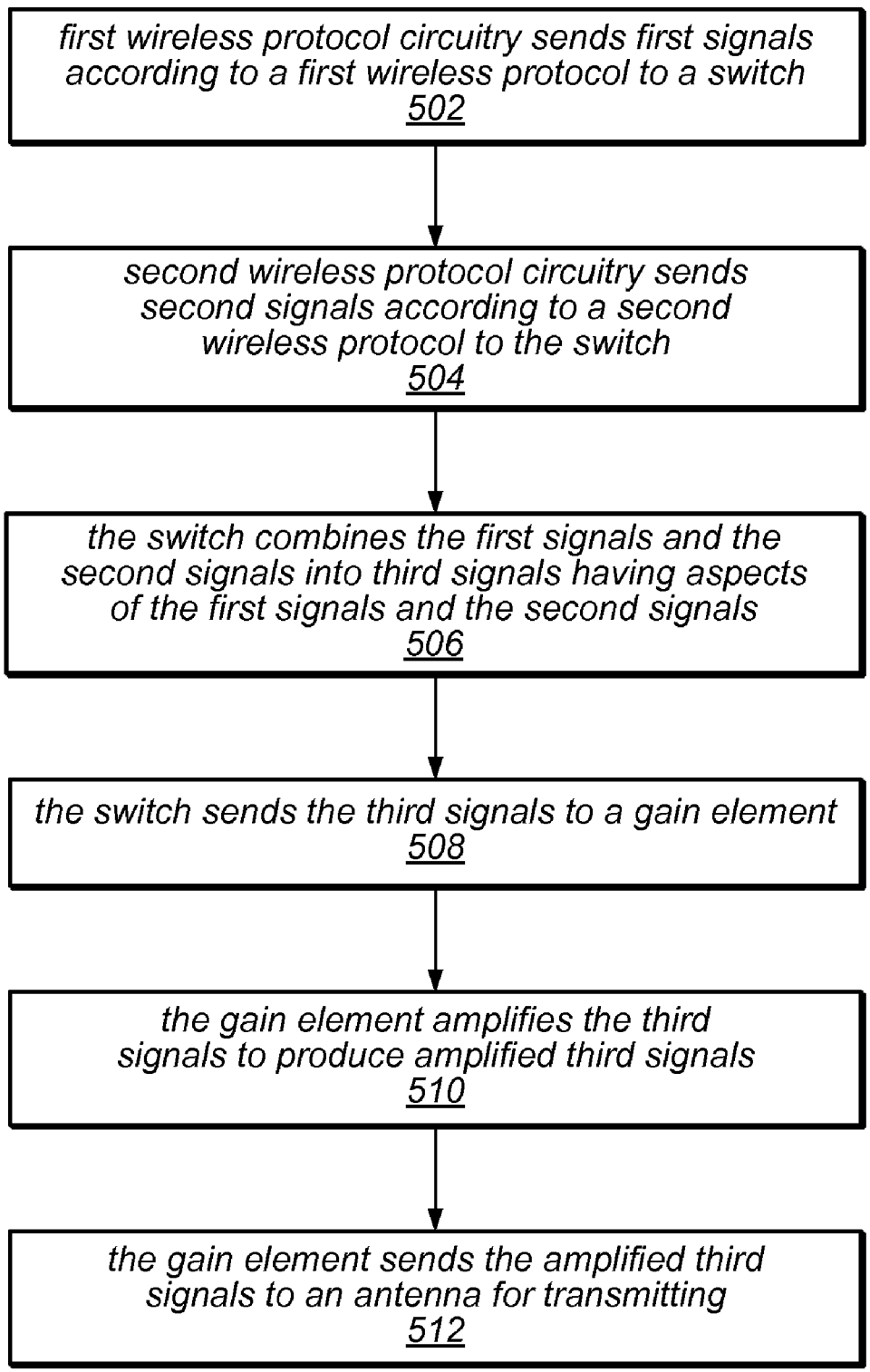
FIG. 5 is a flowchart diagram illustrating a method by which a device simultaneously wirelessly transmits signals according to multiple protocols.

FIG. 5—Flowchart Describing a Method for Simultaneously Wirelessly Transmitting Signals According to Multiple Protocols FIG. 5 illustrates one embodiment of a method for use in a wireless device. The method may allow for simultaneously wirelessly transmitting signals according to multiple protocols. The method shown in FIG. 5 may be used in conjunction with any of the devices shown in the above Figures, among other devices. In various embodiments, some of the method elements shown may be performed concurrently, in a different order than shown, or may be omitted. Additional method elements may also be performed as desired. As shown, this method may operate as follows.

In 502, first wireless protocol circuitry sends first signals according to a first wireless protocol to a switch. The first wireless protocol circuitry may be WLAN circuitry and the first signals may be WLAN signals. The WLAN circuitry may be comprised on the wireless device, e.g., may be comprised on a chip, such as an Application Specific Integrated Circuit (ASIC), as a Field Programmable Gate Array (FPGA), a mixed digital/analog device, or other implementation. The WLAN circuitry may include circuitry and/or logic for generating the WLAN signals as well as circuitry and/or logic for performing additional operations or modifications to the WLAN signals on the way to the switch. Such additional operations and modifications might include digital-to-analog conversion, low pass filtering, and/or low noise amplification, among other possibilities.

In 504, second wireless protocol circuitry sends second signals according to a second wireless protocol to a switch. The second wireless protocol circuitry may be Bluetooth circuitry and the second signals may be Bluetooth signals. The Bluetooth circuitry may be comprised on the wireless device, e.g., may be comprised on a chip, such as an Application Specific Integrated Circuit (ASIC), as a Field Programmable Gate Array (FPGA), a mixed digital/analog device, or other implementation. The Bluetooth circuitry may be located on the same chip as the WLAN circuitry. Alternatively, the Bluetooth circuitry and the WLAN circuitry may be comprised on separate chips. Similar to the WLAN circuitry, the Bluetooth circuitry may include circuitry and/or logic for generating the Bluetooth signals as well as circuitry and/or logic for performing additional operations or modifications to the Bluetooth signals on the way to the switch. Such additional operations and modifications might include digital-to-analog conversion, low pass filtering, and amplification, among other possibilities. The operations and modifications, if any, may be the same for both the Bluetooth and the WLAN signals. Note however that any operations and modifications on the Bluetooth signals are not required to be the same operations and modifications as may be performed on the WLAN signals. Likewise the WLAN signals are not required to be operated upon or modified in the same way as the Bluetooth signals.

In 506, the switch combines the first signals and the second signals into third signals having aspects of the first signals and the second signals. The switch may be a crossbar switch, and may include a combiner. The switch may thus be able to combine the WLAN signals and the Bluetooth signals into third signals.

In 508, the switch sends the third signals to a gain element. As noted above, the switch may be a crossbar switch. The crossbar switch may be able to send the third signals to any of a plurality of gain elements. Alternatively, there may only be a single gain element, and the switch may only send the third signals to the single gain element.

In 510, the gain element amplifies the third signals to produce amplified third signals. As noted above, there may be a plurality of gain elements coupled to the crossbar switch. Each of the plurality of coupled gain elements may be operable to amplify the third signals, in some embodiments by different amounts, to produce amplified third signals. There may for example be two gain elements coupled to the switch, such as the 6 dBm PA 340 and the 21 dBm PA 345 shown in the wireless devices in FIGS. 3 and 4. As noted above, the crossbar switch may in some embodiments be able to send the third signals to any of the plurality of gain elements; the gain element chosen may depend on what at power level the WLAN and/or Bluetooth signals should be transmitted.

In 512, the gain element sends the amplified third signals to an antenna for transmitting. The gain element may send the amplified signals directly or indirectly to the antenna for transmitting. In some embodiments there may be one or more additional gain elements for one or more of the plurality of gain elements, such as the xPA 347 shown in the wireless devices in FIGS. 3 and 4. Any such additional gain elements may further amplify the already amplified third signals. The further amplified signals may then continue on the transmission path. There may be a switch between each of the plurality of gain elements and the antenna, such that signals may be sent from any of the gain elements to the antenna. For example, as in FIG. 4, there may be a single-pole-double-throw switch 450 connecting either the transmit path 456 of the 6 dBm PA 340 or the transmit path 454 of the 21 dBm PA 345 to the transmit path 458 of the transmit antenna 460. Alternatively, as in a single antenna device such as device 100A shown in FIG. 3, there may be a single-pole-triple-throw switch with a throw from the antenna 360 to the shared receive path 352 in addition to throws to transmit paths 354 and 356.

In some embodiments there may be yet more additional elements between the gain element and the antenna. For example, as shown in FIGS. 3 and 4, there may be a cellular coexistence filter 364 and a diplexer 362. A cellular coexistence filter may be useful in certain embodiments in which, for example, the wireless device is a cellular telephone. Thus it may, for example, filter out signals in cellular frequencies so that Bluetooth and/or WLAN may receive signals while cellular signals are being transmitted. In some embodiments, it may also filter out spectral components in the cellular band created by Bluetooth or WLAN signals being transmitted. A diplexer may be useful in certain embodiments in which, for example, WLAN can operate in either the 2 GHz range (e.g. the same as Bluetooth) or in the 5 GHz range.

The antenna may finally transmit the third signals wirelessly. It should be noted that as the third signals may contain aspects of the first signals (e.g. WLAN) and the second signals (e.g. Bluetooth), wirelessly transmitting the third signals may effectively simultaneously wirelessly transmit both the first signals according to the first protocol and the second signals according to the second protocol.

As noted above, in various embodiments, some of the method elements may be performed concurrently, in a different order than shown, or may be omitted. For example, in one embodiment, Bluetooth may begin sending signals before WLAN (or vice versa). Thus in this embodiment, for example, the switch (or another element) may send Bluetooth signals to the next element while WLAN signals are also being received. In another embodiment, Bluetooth and WLAN signals may be sent continuously for a period of time; thus in this embodiment, several (or all) of the steps may be performed concurrently. Other orders and combinations of steps are also envisioned.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A wireless device for simultaneously transmitting first signals according to a first protocol and second signals according to a second protocol, wherein the first protocol and the second protocol are different protocols, comprising:
an antenna for transmitting wireless signals;
first protocol circuitry configured to send first signals according to the first protocol;
second protocol circuitry configured to send second signals according to the second protocol;
a switch coupled to the first protocol circuitry and to the second protocol circuitry; and
a plurality of gain elements coupled to the switch;
wherein the switch comprises a combiner which is configured to combine the first signals and the second signals into third signals which comprise at least a portion of the first signals and at least a portion of the second signals;
wherein the switch is configured to send the third signals to either of a first gain element or a second gain element of the plurality of gain elements;
wherein each of the first and second gain elements is configured to amplify the third signals to produce amplified third signals;
wherein the first gain element is configured to amplify the third signals by a greater amount than the second gain element;
wherein the switch is configured to send the third signals to the first gain element when either the first protocol circuitry or the second protocol circuitry indicates a preferred amplification by the greater amount;
wherein the switch is configured to send the third signals to the second gain element when neither the first protocol circuitry nor the second protocol circuitry indicates the preferred amplification by the greater amount;
wherein the first and second gain elements are switchably coupled to the antenna and are configured to send the amplified third signals to the antenna for transmitting.

2. The wireless device of claim 1,
wherein the switch comprises a crossbar switch and the combiner.

3. The wireless device of claim 1, further comprising:
a second antenna for receiving wireless signals.

4. The wireless device of claim 1,
wherein the antenna is also configured to receive wireless signals.

5. The wireless device of claim 1,
wherein the first protocol is Wireless LAN (WLAN) and the second protocol is Bluetooth.

6. A method for use in a wireless device, for simultaneously transmitting first signals according to a first protocol and second signals according to a second protocol, wherein the first protocol and the second protocol are different protocols, the method comprising:
a first protocol circuitry sending first signals according to the first protocol to a switch;
a second protocol circuitry sending second signals according to the second protocol to the switch;
the switch receiving the first signals and the second signals, combining the first signals and the second signals into third signals which comprise at least a portion of the first signals and at least a portion of the second signals, and sending the third signals to a first gain element,
wherein the switch is coupled to a plurality of gain elements comprising at least the first gain element and a second gain element, wherein the first gain element is configured to amplify the third signals by a greater amount than the second gain element, wherein the switch is configured to send third signals to either of the first gain element or the second gain element;
wherein the switch is configured to send the third signals to the first gain element based on the first protocol circuitry or the second protocol indicating a preferred amplification by the greater amount;
wherein the switch is configured to send the third signals to the second gain element when neither the first protocol circuitry nor the second protocol circuitry indicates the preferred amplification by the greater amount;
the first gain element receiving the third signals, amplifying the third signals to produce amplified third signals, and sending the amplified third signals to an antenna for transmitting.

7. The method of claim 6, wherein the switch comprises a crossbar switch and a combiner.

8. The method of claim 6, further comprising:
the antenna receiving the amplified third signals from one of the first or the second gain element and transmitting wirelessly the amplified third signals.

9. A chip for use in a wireless device, comprising:
first wireless protocol circuitry configured to send first signals according to a first protocol;
second protocol circuitry configured to send second signals according to a second protocol;
a switch coupled to the first protocol circuitry and to the second protocol circuitry; and
a plurality of gain elements coupled to the switch;
wherein the switch comprises a combiner and is configured to combine the first signals and the second signals into third signals which comprise at least a portion of the first signals and at least a portion of the second signals;

wherein the switch is configured to send the third signals to either of a first gain element or a second gain element of the plurality of gain elements;
wherein each of the first and second gain elements is configured to amplify the third signals to produce amplified third signals;
wherein the first gain element is configured to amplify the third signals by a greater amount than the second gain element;
wherein the switch is configured to send the third signals to the first gain element when either the first protocol circuitry or the second protocol circuitry indicates a preferred amplification by the greater amount;
wherein the switch is configured to send the third signals to the second gain element when neither the first protocol circuitry nor the second protocol circuitry indicates the preferred amplification by the greater amount;
wherein the first and second gain elements are configured to send the amplified third signals to an antenna for transmitting; and
wherein the first protocol and the second protocol are different protocols.

10. The chip of claim 9,
wherein the switch comprises a crossbar switch and the combiner.

11. The wireless device of claim 1,
wherein the first wireless protocol circuitry and the second wireless protocol circuitry are comprised on a chip.

12. The wireless device of claim 1,
wherein the first protocol circuitry is configured to send the first signals at a first frequency, wherein the second protocol circuitry is configured to send the second signals at a second frequency, wherein the first frequency and the second frequency are different frequencies.

13. The wireless device of claim 1,
wherein the first protocol circuitry is configured to send the first signals at a first frequency, wherein the second protocol circuitry is configured to send the second signals at a second frequency, wherein the first frequency and the second frequency are different frequencies within the same frequency band.

14. The wireless device of claim 1, further comprising:
a third gain element coupled to the switch, wherein the third gain element is configured to amplify signals by a different amount than the first and second gain elements;
wherein the switch is configured to send the third signals to either the first gain element, the second gain element, or the third gain element.

15. The wireless device of claim 1, further comprising:
at least one additional gain element configured in series with at least one of the first gain element or the second gain element.

16. The method of claim 6,
wherein the plurality of gain elements coupled to the switch further comprise a third gain element, wherein the third gain element is configured to amplify signals by a different amount than the first and second gain elements;
wherein the switch is configured to send the third signals to either the first gain element, the second gain element, or the third gain element.

17. The method of claim 6,
wherein the first gain element and the second gain element are switchably coupled to the antenna.

18. The chip of claim 9, further comprising:
a third gain element coupled to the switch, wherein the third gain element is configured to amplify signals by a different amount than the first and second gain elements;
wherein the switch is configured to send the third signals to either the first gain element, the second gain element, or the third gain element.

19. The chip of claim 9,
wherein the first gain element and the second gain element are switchably coupled to the antenna.

* * * * *